(12) United States Patent
Ahn et al.

(10) Patent No.: US 10,090,478 B2
(45) Date of Patent: Oct. 2, 2018

(54) FLEXIBLE ORGANIC LIGHT EMITTING DIODE DISPLAY

(71) Applicant: Samsung Display Co., Ltd., Yongin (KR)

(72) Inventors: Sung Sang Ahn, Hwaseong-si (KR); Chang Min Park, Gwangmyeong-si (KR); Sang Wol Lee, Yongin-si (KR); Gyeong Ho Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 626 days.

(21) Appl. No.: 14/605,823

(22) Filed: Jan. 26, 2015

(65) Prior Publication Data

US 2016/0041679 A1   Feb. 11, 2016

(30) Foreign Application Priority Data

Aug. 11, 2014   (KR) .................. 10-2014-0103783

(51) Int. Cl.
| | | |
|---|---|---|
| *H01L 51/00* | (2006.01) | |
| *G06F 3/044* | (2006.01) | |
| *H01L 51/52* | (2006.01) | |
| *H01L 27/32* | (2006.01) | |

(52) U.S. Cl.
CPC .......... *H01L 51/0097* (2013.01); *G06F 3/044* (2013.01); *H01L 51/5246* (2013.01); *G06F 2203/04102* (2013.01); *G06F 2203/04103* (2013.01); *H01L 27/323* (2013.01); *Y02E 10/549* (2013.01)

(58) Field of Classification Search
CPC ............... H01L 27/323; H01L 51/0097; H01L 51/5246
USPC ...................................................... 345/76–83
See application file for complete search history.

(56) References Cited

U.S. PATENT DOCUMENTS

2014/0132488 A1*  5/2014  Kim ..................... H01L 51/52
                                                           345/76

FOREIGN PATENT DOCUMENTS

| JP | 2006-286242 | 10/2006 |
|---|---|---|
| KR | 10-2012-0046427 | 5/2012 |
| KR | 10-2012-0062191 | 6/2012 |
| KR | 10-2014-0039262 | 4/2014 |

OTHER PUBLICATIONS

Machine translation for KR 1020120046427 A.*

* cited by examiner

*Primary Examiner* — Michael Pervan
(74) *Attorney, Agent, or Firm* — H.C. Park & Associates, PLC (57) ABSTRACT

The organic light emitting diode display may comprise a cover window including a display region and a non-display region that surrounds the display region; a flexible substrate arranged on a lower portion of the cover window, and including a first region that is spaced apart from the cover window and a second region that extends from the first region toward the cover window; and an adhesive layer arranged between the cover window and the flexible substrate to make the cover window and the flexible substrate adhere to each other.

7 Claims, 10 Drawing Sheets

FLEXIBLE ORGANIC LIGHT EMITTING DIODE DISPLAY

CROSS-REFERENCE TO RELATED APPLICATIONS

This application claims priority from and the benefit of Korean Patent Application No. 10-2014-0103783, filed on Aug. 11, 2014, which is hereby incorporated by reference for all purposes as if fully set forth herein.

BACKGROUND

Field

Exemplary embodiments of the present invention relate to an organic light emitting diode display.

Discussion of the Background

A flexible display is a next-generation display that is an information delivery medium suited to today's consumer. The flexible display is not only strong against an external impact, convenient to be carried, lightweight, and small, but also able to be implemented as a panel in any shape. In particular, the flexible display has flexibility enough to be folded or rolled like a sheet of paper.

The active-matrix organic light emitting diode (AMOLED) display that has currently been commercialized is vulnerable to moisture and oxygen existing in the atmosphere. In order to strengthen the competitiveness of a flexible display using a polymer substrate, there is a need for a technology to effectively prevent permeation of moisture and oxygen. If the moisture and oxygen are not effectively prevented from permeating, defects, such as discoloration of a polarizing element and deterioration or oxidization of organic materials and electrodes, for example, may occur, which severely reduce the lifespan of the display.

Technology to prevent an inflow of moisture and oxygen to an organic light emitting diode display may include a sealing agent injection method to inject a sealing agent into a space between a base substrate and a cover window, and an anti-moisture adhesive film attachment method to attach an adhesive film to a base substrate and a cover window and to seal the edge thereof.

However, in order for the sealing agent injection method to prevent the inflow of oxygen and moisture, it may be required for the sealing agent to cover a part of one face of the base substrate. Accordingly, in the case of adopting the sealing agent injection method, the thickness of the organic light emitting diode display is increased as large as the thickness of the sealing agent that covers a part of one face of the base substrate.

In the same manner, in order for the anti-moisture adhesive film attachment method to prevent the inflow of oxygen and moisture, it may be required for the anti-moisture adhesive film to cover a part of one face of the base substrate. Accordingly, in the case of adopting the anti-moisture adhesive film attachment method, the thickness of the organic light emitting diode display is increased as large as the thickness of the anti-moisture adhesive film that covers a part of one face of the base substrate.

SUMMARY

Exemplary embodiments of the present invention provide an organic light emitting diode display having an improved sealing structure which can reliably prevent an inflow of moisture and oxygen while not increasing the overall thickness by using a base substrate that constitutes the organic light emitting diode display.

Additional advantages, subjects, and features of the invention will be set forth in part in the description which follows and in part will become apparent to those having ordinary skill in the art upon examination of the following or may be learned from practice of the invention.

An exemplary embodiment of the present invention discloses an organic light emitting diode display, including a cover window including a display region and a non-display region that surrounds the display region; a flexible substrate arranged on a lower portion of the cover window, and including a first region that is spaced apart from the cover window and a second region that extends from the first region toward the cover window; and an adhesive layer arranged between the cover window and the flexible substrate to make the cover window and the flexible substrate adhere to each other.

An exemplary embodiment of the present invention also discloses an organic light emitting diode display including a cover window including a display region and a non-display region that surrounds the display region; a flexible substrate arranged on a lower portion of the cover window to be spaced apart from the cover window, and including a first region and a second region that extends from the first region; and a sealing agent filling a space between the second region of the flexible substrate and the cover window.

According to exemplary embodiments of the present invention, at least the following effects can be achieved.

The flexible organic light emitting diode display according to exemplary embodiments of the present invention has a sealing structure that prevents the inflow of moisture and oxygen to the flexible substrate constituting the display. Accordingly, quality deterioration due to the inflow of moisture and oxygen can be prevented, and the thickness of the flexible organic light emitting diode display is not increased because of the sealing structure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims.

In the drawings, the thickness of layers and regions are exaggerated for clarity. As used herein, the term "and/or" includes any and all combinations of one or more of the associated listed items.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other. Like numbers refer to like elements throughout. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Exemplary embodiments will hereinafter be described with reference to the accompanying drawings.

Figure 1:
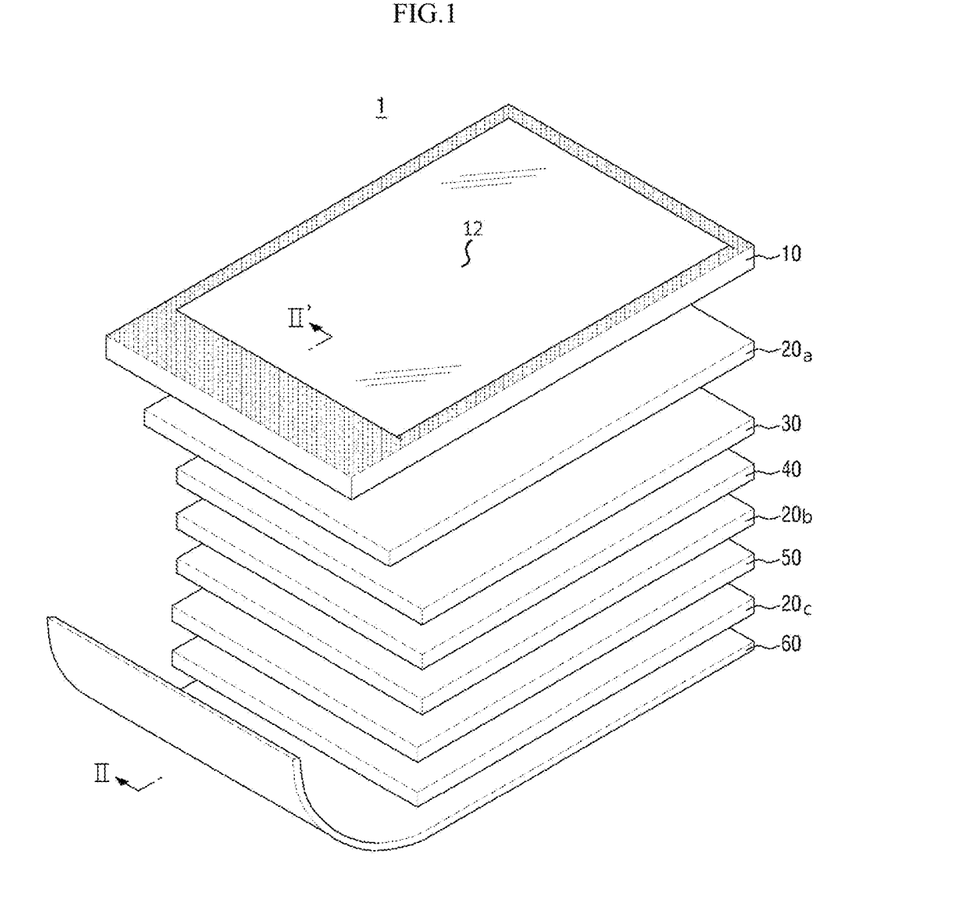
FIG. 1 is a schematic exploded perspective view of an organic light emitting diode display according to exemplary embodiments of the present invention.
Figure 2:
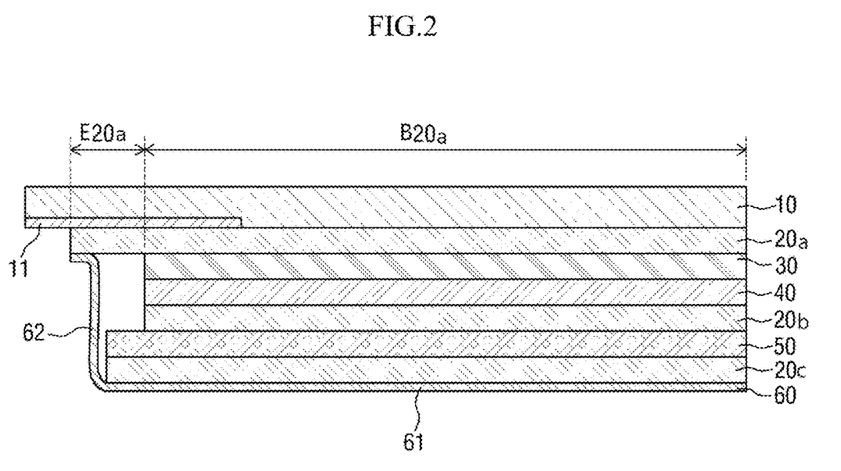
FIG. 2 is a schematic cross-sectional view taken along line II-II' of FIG. 1.

FIG. 1 is a schematic exploded perspective view of an organic light emitting diode display according to a first exemplary embodiment of the present invention. FIG. 2 is a schematic cross-sectional view taken along line II-IF of FIG. 1.

Referring to FIGS. 1 and 2, a flexible organic light emitting diode display 1 may be configured to include a display panel assembly 50 for displaying an image, a cover window 10 positioned on an outside of a display surface of the display panel assembly 50, a touch screen panel 40 attached to the display surface of the display panel assembly 50, a polarizing element 30 arranged between the touch screen panel 40 and the cover window 10, and a base substrate 60 arranged on a lower portion of the display panel assembly 50.

Further, the flexible organic light emitting diode display 1 may include adhesive layers 20*a*, 20*b*, and 20*c*. The adhesive layer 20*a* may be arranged between the display panel assembly 50 and the cover window 10. The adhesive layer 20*a* may also be arranged between the touch screen panel 40 and the cover window 10. The adhesive layer 20*b* may be arranged between the touch screen panel 40 and the display panel assembly 50. The adhesive layer 20*c* may be arranged between the display panel assembly 50 and the base substrate 60.

The cover window 10 may be positioned on the outside of the display surface of the display panel assembly 50 to protect the display panel assembly 50 against external impacts or scratches. The cover window 10 may be formed of a transparent material, such as transparent plastic. The cover window 10 may include a display region 12 in which an image of the display panel assembly 50 can be visually recognized and a non-display region 11 (shown in FIG. 2) that surrounds the display region 12. The non-display region 11 (in FIG. 2) may be configured to hide a portion of the display region 12 in which an image is not displayed.

The adhesive layers 20*a*, 20*b*, and 20*c* may include acrylic resin that is cured by UV rays. However, aspects need not be limited thereto such that the adhesive layers 20*a*, 20*b*, and 20*c* may be cured or crosslinked by other wavelengths of light/radiation, by heat, and/or by chemicals.

The adhesive layer 20*a*, which is initially a liquid or paste, may be spread on the cover window 10, and then may be cured by UV rays after the base substrate 60, the display panel assembly 50, the touch screen panel 40, and the polarizing element 30, are stacked thereon. The adhesive layer 20a may include a main body portion B20a and an extension portion E20a that extends away from the main body portion B20a. In comparative examples of existing flexible organic light emitting diode display 1, the adhesive layer 20a is composed of the main body portion B20a only. However, according to the organic light emitting diode display 1 of an exemplary embodiment of the present invention, the adhesive layer 20a may include the main body portion B20a and the extension portion E20a.

The adhesive layer 20b, which is initially a liquid or paste, may be spread on the touch screen panel 40, and then may be cured by UV rays after the base substrate 60, the display panel assembly 50, the polarizing element 30, and the cover window 10 are stacked thereon. The size or area of the adhesive layer 20b may correspond to the size or area of the main body portion B20a of the adhesive layer 20a. The adhesive layer 20b is spread on the face of the touch screen panel 40, and may have the same area as the area of the touch screen panel 40. The main body portion B20a may have the same area as the area of the touch screen panel 40.

The adhesive layer 20c, which is initially a liquid or paste, may be spread on the display panel assembly 50, and then may be cured by UV rays after the base substrate 60, the touch screen panel 40, the polarizing element 30, and the cover window 10 are stacked thereon. The adhesive layer 20c is spread on the face of the display panel assembly 50, and may have the same area as the area of the display panel assembly 50.

The polarizing element 30 may change the optical axis of light that is emitted to the outside through the display panel 120. The polarizing element 30 may have a structure in which a transparent protection film is stacked on one face or both faces of a polarizer. The polarizer may be made of polyvinyl alcohol (PVA)-based resin. More specifically, the polarizing element 30 may have a structure in which a triacetylcellulose (TAC) protection film adheres to a polarizer. The polarizer may have a structure in which PVA-based molecular chains are aligned in a constant direction and an iodine-based compound or dichroic polarizing material is included. In general, the polarizer and the protection film may adhere to each other by water-based adhesives, for example, a polyvinyl alcohol-based aqueous solution. However, the polarizing element 30 is not limited thereto, and polarizing elements having various structures may be used.

The touch screen panel 40 may convert a contact position of the organic light emitting display 1 that is in direct contact with a hand or an object into an electric signal. Accordingly, the instruction contents that are selected at the contact position may be received as an input signal. The touch screen panel 40 may be a flexible touch screen panel. The touch screen panel 40 may adopt various touch types, such as a capacitive type and a resistance type.

The display panel assembly 50 may display an image. The display panel assembly 50 may include organic light emitting elements. The display panel assembly 50 will be described later, with reference to FIG. 4.

The base substrate 60 may be positioned on the lower portion of the display panel assembly 50, and may protect the display panel assembly 50. The base substrate 60 may include, for example, a polymer film.

For example, the base substrate 60 may be made of any one polymer selected from the group including polyethylene terephthalate (PET), polyethylene naphthalate (PEN), polyethylene sulfide (PES), polyethylene (PE), urethane, polycarbonate, and polyimide (PI).

The thickness of the base substrate 60 may be equal to or larger than 25 μm and equal to or smaller than 300 μm. If the thickness of the base substrate 60 is smaller than 25 μm, it is too thin to serve as a lower protection film for protecting a lower portion of the flexible organic light emitting diode display 1. If the thickness of the base substrate 60 is larger than 300 μm, it may be difficult for the organic light emitting diode display to have flexibility.

The base substrate 60 may be an organic/inorganic composite film that prevents an inflow of external oxygen and moisture. The organic/inorganic composite film may have a structure in which at least one organic protection film layer is alternately stacked with at least one inorganic protection film layer. The inorganic protection film may prevent an inflow of oxygen and moisture, and the organic protection film may improve impact resistance.

The inorganic protection film may be made of silicon oxide (SiO2), silicon nitride (SixNy), silicon oxynitride (SiON), aluminum oxide (AlOx), aluminum nitride (AlN), TIO, or ZnO, but is not limited thereto.

A monomer or polymer thin film may be used as the organic protection film. The monomer may be provided by using acrylate monomer, phenylacetylene, diamine and dianhydride, siloxane, silane, or parylene, but is not limited thereto.

As shown in FIG. 2, the base substrate 60 may include a first region 61 that corresponds to an area of the display panel assembly 50, and a second region 62 that extends from the first region 61. The first region 61 is spaced apart from the cover window 10 at a predetermined interval, but the second region 62 is bent toward the cover window 10 to adhere to the cover window 10. The end of the second region 62 may adhere to the non-display region 11 of the cover window 10.

The extension portion E20a of the adhesive layer 20a may adhere the second region 62 of the base substrate 60 to the cover window 10. In other words, the second region 62 of the base substrate 60 may adhere to the extension portion E20a of the adhesive layer 20a. The adhesive layer 20c may adhere the first region 61 of the base substrate 60 to the display panel assembly 50.

The second region 62 of the base substrate 60 may cover the side face of the display panel assembly 50, and may be bent toward the cover window 10 to contact to the extension portion E20a of the adhesive layer 20a. As stated above, in the flexible organic light emitting diode display 1, the first region 61 of the base substrate 60 may include an anti-moisture adhesive film or may not be covered by a sealing agent. Accordingly, in comparison to the existing sealing agent injection method or anti-moisture adhesive film attachment method, the thickness of the anti-moisture adhesive film that covers the first region 61 or the thickness of the sealing agent can be reduced.

Figure 3:
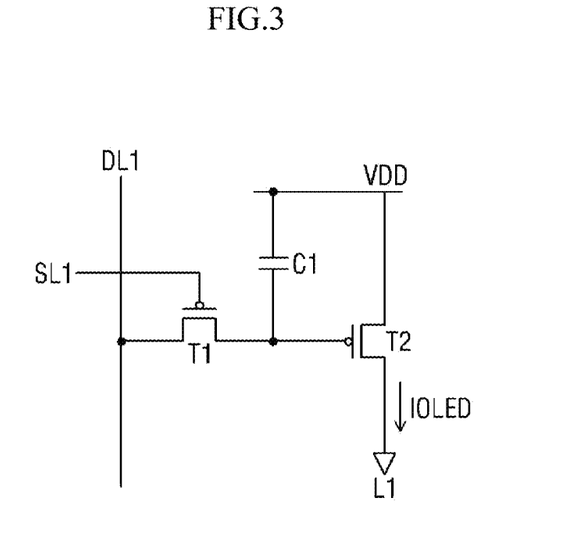
FIG. 3 is a pixel circuit diagram of a display panel assembly illustrated in FIG. 1.
Figure 4:
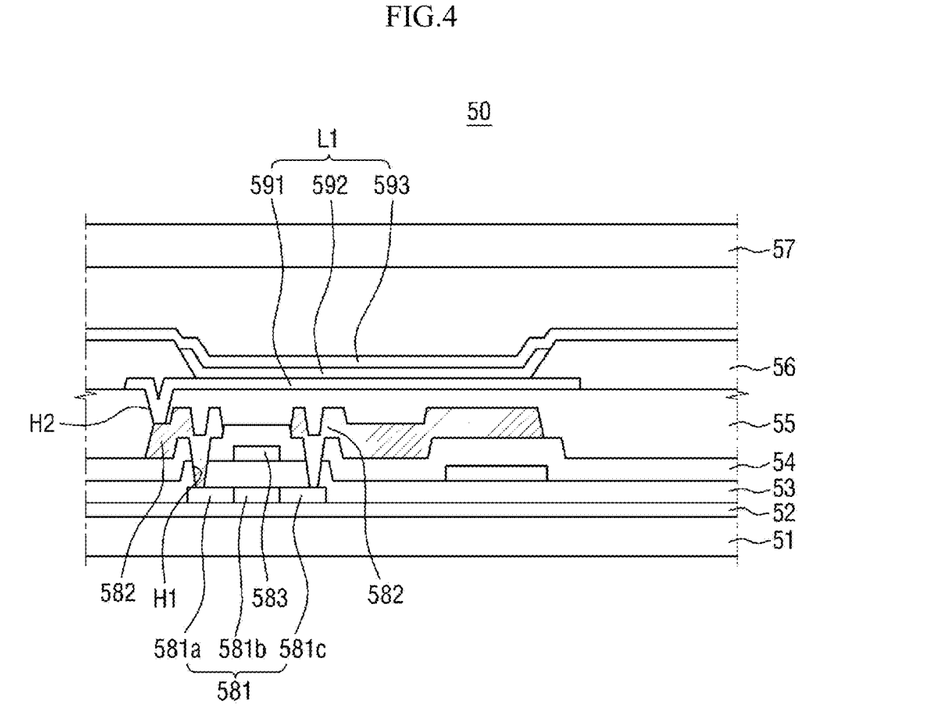
FIG. 4 is a schematic partial enlarged cross-sectional view of a display panel assembly illustrated in FIG. 1.

FIG. 3 is a pixel circuit diagram of the display panel assembly 50 illustrated in FIG. 1, and FIG. 4 is a schematic partial enlarged cross-sectional view of the display panel assembly 50 illustrated in FIG. 1.

Referring to FIGS. 3 and 4, a pixel may include an organic light emitting diode L1 and driving circuit portion T1, T2, and C1. The organic light emitting diode L1 may include a pixel electrode 591, an organic light emitting layer 592, and a common electrode 593. The driving circuit portion T1, T2, and C1 may include at least two thin film transistors (a switching transistor T1 and a driving transistor T2) and at least one capacitor C1.

One of the pixel electrode 591 and the common electrode 593 may be an electron injection electrode, and the other may be a hole injection electrode. If electrons and holes are injected into the organic light emitting layer 592, they are combined to generate excitions, and as the excitions emit energy, light emission is performed.

The switching transistor T1 is connected to a scan line SL1 and a data line DL1, and transmits a data voltage that is input from the data line DL1 to the driving transistor T2 according to a switching voltage that is input to the scan line SL1. The capacitor C1 is connected to the switching transistor T1 and a power supply line VDD, and stores a voltage that corresponds to a difference between the voltage that is transmitted from the switching transistor T1 and the voltage that is supplied to the power supply line.

The driving transistor T2 is connected to the power supply line VDD and the capacitor C1 to supply output current IOLED that is proportional to the square of a difference between the voltage stored in the capacitor C1 and a threshold voltage to the organic light emitting diode L1. Thus, the organic light emitting diode L1 emits light with a strength that is proportional to the output current IOLED.

Referring to FIG. 4, the driving transistor T2 may include a semiconductor layer 581, a gate electrode 583, and a source/drain electrode 582, and the pixel electrode 591 may be connected to a drain electrode 235 of the driving transistor T2. The pixel electrode 591 may be formed of a metal layer that may be configured to reflect light, and the common electrode 593 is formed of a transparent conductive layer that may be configured to transmit light. The light that may be generated from the organic light emitting layer 592 may be reflected by the pixel electrode 591, and may penetrate the common electrode 593 and an encapsulation substrate 57 to emit out of the display panel assembly 50.

The display panel assembly 50 may include a display substrate 51, a semiconductor layer 581, a buffer layer 52, a gate electrode 583, a gate insulating layer 53, a source/drain electrode 582, an interlayer insulating layer 54, a planarization layer 55, a pixel defining layer 56, and an encapsulation substrate 57. A touch screen panel 40 (in FIG. 1) may be arranged on the encapsulation substrate 57.

The display substrate 51 and the encapsulation substrate 57 may be formed of a polymer film. For example, the display substrate 51 may be made of polyimide (PI). Like the second region 62 of the base substrate 60, the display substrate 51 may be bent to extend toward the cover window 10, and may contact the extension portion E20a of the adhesive layer 20a. In other words, the concept of bending and extending the flexible substrate toward the cover window 10 is not limited to the base substrate 60 illustrated in FIG. 1, but can extend to the display substrate 51. Further, within the range of technical idea according to the first exemplary embodiment of the present invention, both the display substrate 51 and the base substrate 60 may be bent and extended toward the cover window 10. In this case, the adhesive layer 20c may be disposed between the extension portions of the display substrate 51 and the base substrate 60. That is, the adhesive layer 20c is interposed between the extension portions of the display substrate 51 and the base substrate 60, so the moisture and oxygen inflow prevention may be further improved.

A plurality of signal lines (including scan lines and data lines) and a plurality of pixels may be positioned in the display region of the display substrate 51, and a plurality of metal wires (not illustrated) that are connected to the plurality of signal lines may be positioned in the pad region.

The display panel assembly 50 may include a first integrated circuit chip (not illustrated) that is mounted on the pad region using a chip-on-glass (COG) method. The first integrated circuit chip (not illustrated) may include any one of a scan driving unit and a data driving unit. The scan driving unit may supply scan signals to the plurality of pixels through scan lines, and the data driving unit may supply data signals to the plurality of pixels through data lines.

The encapsulation substrate 57 may be smaller than the size of the display substrate 51. The encapsulation substrate 57 may be attached to the display region of the display substrate 51. The display substrate 51 and the encapsulation substrate 57 may be integrally bonded to each other by a sealing agent (not illustrated) spread along the edge of the encapsulation substrate 57.

The encapsulation substrate 57 may seal the pixels to protect the pixels against the external atmosphere including moisture and oxygen. Additionally or alternatively, instead of the encapsulation substrate 57, a thin film encapsulation layer, in which at least one organic layer and at least one inorganic layer are alternately laminated one by one, may be provided.

The plurality of pixels provided on the display substrate 51 may emit light toward the encapsulation substrate 57, and an outer face of the encapsulation substrate 57 may be a display surface of the display panel assembly 50. The touch screen panel 40 is attached to the outer face of the encapsulation substrate 57 and overlaps the display region. The touch screen circuit film (not illustrated) may be electrically connected to electrodes of the touch screen panel 40. The touch screen circuit film (not illustrated) may be positioned on an upper portion of the pad region.

The buffer layer 52 may be formed on the display substrate 51. The buffer layer 52 may be formed of, for example, a silicon nitride layer, a silicon oxide layer, a silicon oxynitride layer, or a multilayer thereof.

The semiconductor layer 581 may be formed by depositing amorphous silicon on an upper portion of the buffer layer 52, patterning, and then crystallizing the amorphous silicon.

The gate insulating layer 53 may be formed on the semiconductor layer 581.

The gate electrode 583 may be formed on the gate insulating layer 53 in the region that corresponds to the semiconductor layer 581. The gate insulating layer 53 may be, for example, a silicon oxide layer, a silicon nitride layer, a silicon oxynitride layer, or a multilayer thereof. A source region 581c and a drain region 581a may be formed by injecting a conductive impurity into the semiconductor layer 581 using the gate electrode 583 as a mask. In this case, a channel region 581b is defined between the source/drain regions 581a and 581c.

The interlayer insulating layer 54 may be formed on an upper portion of the gate electrode 583 over the whole surface of the display substrate 51. The interlayer insulating layer 54 may be, for example, a silicon oxide layer, a silicon nitride layer, a silicon oxynitride layer, or a multilayer thereof.

A contact hole H1 may be formed to penetrate the gate insulating layer 53 and the interlayer insulating layer 54. The contact hole H1 may expose the source/drain regions 581a and 581c.

The source/drain electrodes 582 may be formed by laminating and patterning a conductive layer on the substrate on which the contact hole H1 is formed. The source/drain electrodes 582 are connected to the source/drain regions 581a and 581c through the contact hole H1.

The planarization layer 55 may be formed on an upper portion of the source/drain electrode 582 over the whole surface of the substrate. The planarization layer 55 may be formed, for example, of a kind of material selected from the group including polyimide, benzocyclobutene series resin, and acrylate.

A via hole H2 that exposes the source/drain electrodes 582 may be formed on the planarization layer 55. The source/drain electrodes 582 that are exposed by the via hole H2 are connected to the pixel electrode 591 formed on the planarization layer 55.

The pixel electrode 591 may be made of, for example, ITO or IZO, and may include a reflective layer that is made of metal having the characteristics of high reflectivity, such as Al, Al—Nd, or Ag. In a case of bottom emission, a reflective layer may not be included, and one of ITO and IZO, which are transparent conductive layers, may be formed.

An opening is formed by forming and patterning the pixel defining layer 56 on the pixel electrode 591. The pixel defining layer 56 serves to divide the plurality of pixels. The pixel defining layer 56 may be formed of a kind of material selected from, for example, the group including polyimide, benzocyclobutene series resin, and acrylate.

The pixel circuit illustrated in FIG. 3 and the cross-sectional structure of the display panel assembly 50 illustrated in FIG. 4 are merely exemplary, and the organic light emitting diode display 1 according to the first embodiment can be diversely modified without being limited to the above-described example.

Figure 5:
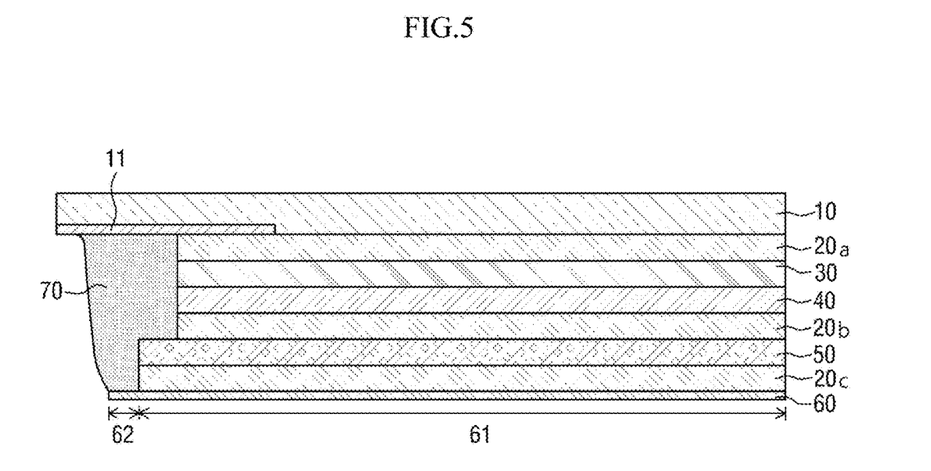
FIG. 5 is a schematic cross-sectional view of an organic light emitting diode display according to exemplary embodiments of the present invention.

FIG. 5 is a schematic cross-sectional view of an organic light emitting diode display according to a second exemplary embodiment of the present invention.

Referring to FIG. 5, a flexible organic light emitting diode display according to a second exemplary embodiment of the present invention is different from the flexible organic light emitting diode display of FIG. 2 on the point that the second region 62 of the base substrate 60 is not bent toward the cover window 10, but is spaced apart from the cover window 10 in the same manner as the first region 61. That is, the second region 62 horizontally extends from the first region 61 without being bent, and forms a space with the cover window 10.

The flexible organic light emitting diode display according to a second exemplary embodiment of the present invention is also different from that of FIG. 2 on the point that a sealing agent 70 fills the space between the second region 62 and the cover window 10. That is, the sealing agent 70 fills the space between the upper face of the base substrate 60 of the second region 62 and the lower face of the cover window 10. The sealing agent 70 may be made of a material that can intercept an inflow of moisture and oxygen.

Since the second region 62 horizontally extends and the sealing agent 70 is injected into the space between the second region 62 and the cover window 10, the side face of the display panel assembly 50 may prevent the inflow of moisture and oxygen. Further, since the sealing agent 70 does not cover the first region 61 and the lower face of the base substrate 60 of the second region, the increase of the thickness that is caused by a coating layer of the sealing agent 70 does not occur.

The adhesive layer 20a is spread on the cover window 10. The lower face of the cover window 10 and one face of the adhesive layer 20a may directly adhere to each other, and the other face of the adhesive layer 20a may directly adhere to an upper face of the polarizing element 30. A side face of the adhesive layer 20a that connects the one face and the other face thereof may be covered by the sealing agent 70.

In the same manner, one face of the polarizing element 30 may be directly attached to a lower face of the adhesive layer 20, and the other face thereof may directly adhere to the upper face of the touch screen panel 40. A side face of the polarizing element 30 may be covered by the sealing agent 70.

In the same manner, one face of the touch screen panel 40 may be attached to a lower face of the polarizing element 30, and the other face thereof may directly adhere to the upper face of the adhesive layer 20b. A side face of the touch screen panel 40 may be covered by the sealing agent 70.

In the same manner, a lower face of the display panel assembly 50 may directly adhere to the upper face of the adhesive layer 20c, and a side face thereof may be covered by the sealing agent 70. An upper face of the display panel assembly 50 may include a region that is covered by the sealing agent 70 and a region that adheres to the adhesive layer 20c.

The upper face of the adhesive layer 20c may adhere to the lower face of the display panel assembly 50, the lower face thereof may adhere to the first region 61 of the base substrate 60, and the side face thereof may be covered by the sealing agent 70.

Like the second region 62 of the base substrate 60, the display substrate 51 of the display panel assembly 50 may extend horizontally, and the sealing agent 70 may be injected into the space between the display substrate 51 and the cover window 10.

Further, through combination of the first embodiment and the second embodiment, the sealing agent 70 may be injected into the space between the second region 62 of the base substrate 60 and the cover window 10, and then the second region 62 may be bent to extend toward the cover window 10.

Figure 6:
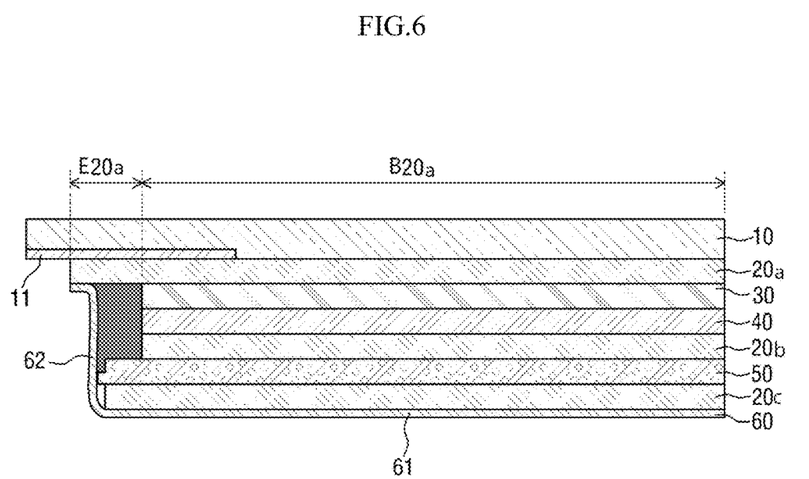
FIG. 6 is a schematic cross-sectional view of an organic light emitting diode display according to exemplary embodiments of the present invention.

That is, referring to FIG. 6 that is a schematic cross-sectional view of an organic light emitting diode display according to a third exemplary embodiment of the present invention, the display substrate 51 may horizontally extend, the sealing agent 70 may be injected into the space between the display substrate 51 and the cover window 10, and the second region 62 of the base substrate 60 may be bent to extend toward the cover window 10 to adhere to the extension portion E20a.

Figure 7:
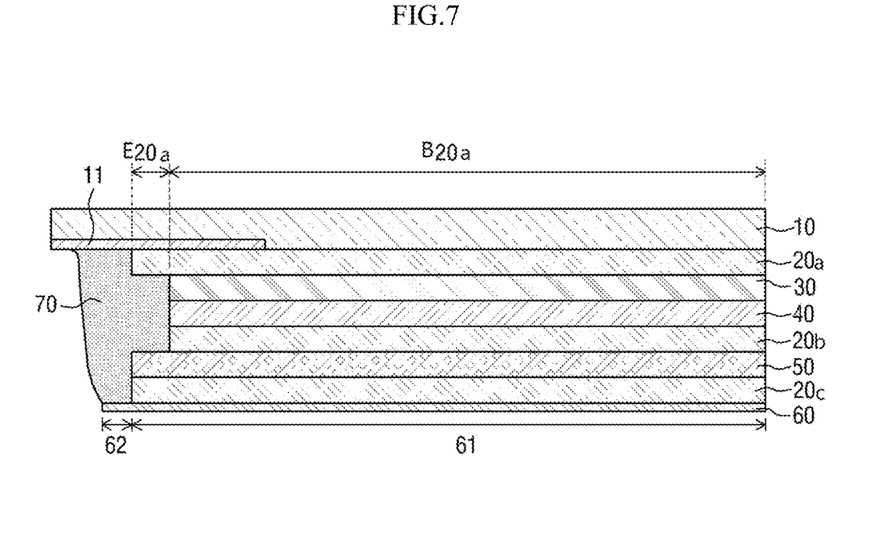
FIG. 7 is a schematic cross-sectional view of an organic light emitting diode display according to exemplary embodiments of the present invention.

FIG. 7 is a schematic cross-sectional view of an organic light emitting diode display according to a fourth exemplary embodiment of the present invention.

Referring to FIG. 7, a flexible organic light emitting diode display according to a fourth exemplary embodiment of the present invention is different from the flexible organic light emitting diode display of FIG. 5 in that the adhesive layer 20a is configured to include a main body portion B20a and an extension portion E20a that horizontally extends from the main body portion B20a.

An upper face of the extension portion E20a of the adhesive layer 20a may adhere to the lower face of the cover window 10, a side face thereof may be covered by the sealing agent 70, and a lower face thereof may include a region that is covered by the sealing agent 70.

Figure 8:
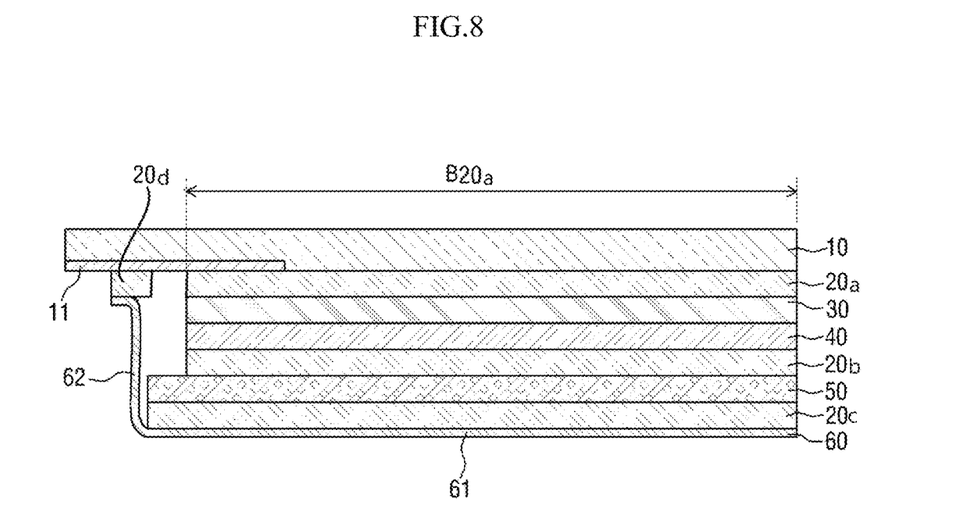
FIG. 8 is a schematic cross-sectional view of an organic light emitting diode display according to exemplary embodiments of the present invention.

FIG. 8 is a schematic cross-sectional view of an organic light emitting diode display according to a fifth exemplary embodiment of the present invention.

Referring to FIG. 8, a flexible organic light emitting diode display according to a fifth exemplary embodiment of the present invention is different from the flexible organic light emitting diode display of FIG. 2 on the point that the adhesive layer 20a includes only the main body portion B20a, and the second region 62 of the base substrate 60 adheres to the cover window 10 by an adhesive layer 20*d* that is spaced apart from the main body portion B20*a* on the same plane.

Instead of extending the adhesive layer 20*a* and making the second region 62 that is bent to extend toward the cover window 10 adhere to the extension portion E20*a* as in FIG. 2, the second region 62 of the base substrate 60 may adhere to the cover window 10 by using a separate adhesive layer 20*d* that is separated or spaced apart from the adhesive layer 20*a*.

Figure 9:
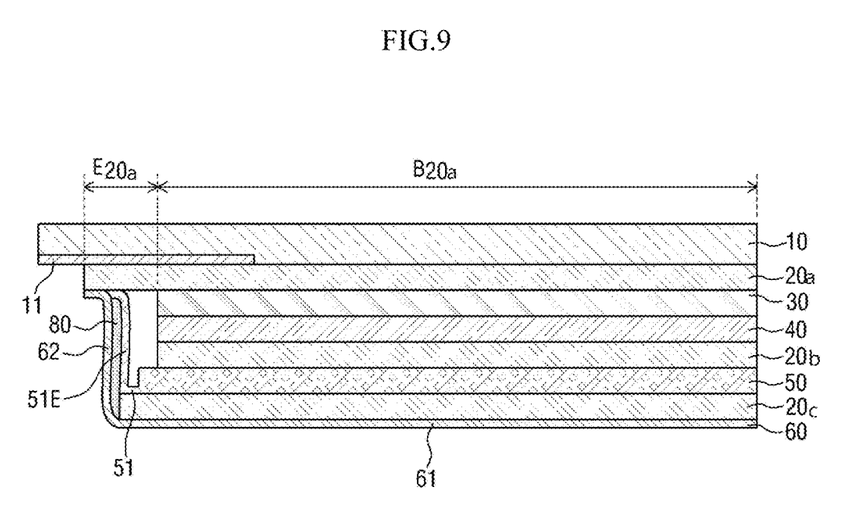
FIG. 9 is a schematic cross-sectional view of an organic light emitting diode display according to exemplary embodiments of the present invention.

FIG. 9 is a schematic cross-sectional view of an organic light emitting diode display according to a sixth exemplary embodiment of the present invention.

Referring to FIG. 9, a flexible organic light emitting diode display according to a sixth exemplary embodiment of the present invention is different from the flexible organic light emitting diode display of FIG. 2 in that both the display substrate 51 of the display panel assembly 50 and the base substrate 60 are bent to extend toward the cover window 10, and an adhesive layer 80 exists between the display substrate 51 and the extension portions 62 and 51E of the base substrate 60. The adhesive layer 80 may extend from the adhesive layer 20*c*. Since the adhesive layer 80 is interposed between the display substrate 51 and the extension portions 51E and 62 of the base substrate 60, the moisture and oxygen inflow prevention can be further improved.

Figure 10:
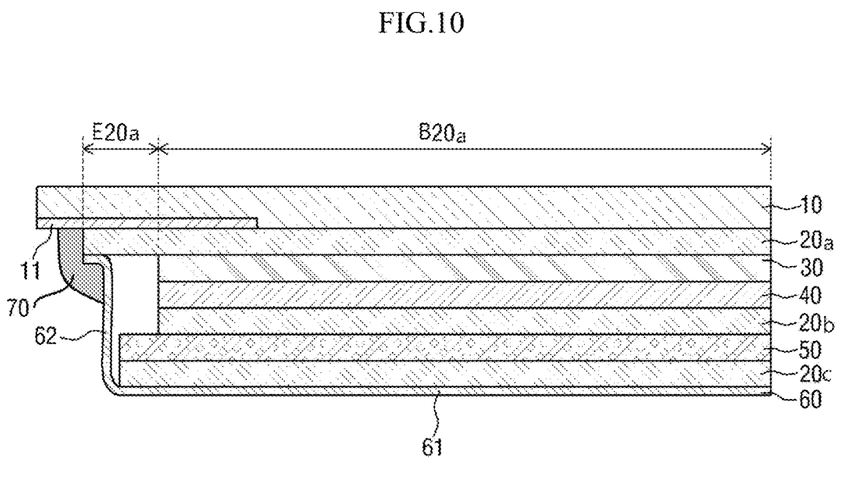
FIG. 10 is a schematic cross-sectional view of an organic light emitting diode display according to exemplary embodiments of the present invention.

FIG. 10 is a schematic cross-sectional view of an organic light emitting diode display according to a seventh exemplary embodiment of the present invention.

Referring to FIG. 10, a flexible organic light emitting diode display according to a seventh exemplary embodiment of the present invention is different from the flexible organic light emitting diode display of FIG. 2 on the point that the base substrate 60 is composed of an organic/inorganic composite film, and an adhesion interface between a side face of the extension portion E20*a* of the adhesive layer 20*a* and the second region 62 of the base substrate 60 is protected by the sealing agent 70.

While the invention has been particularly shown and described with reference to exemplary embodiments thereof, it will be understood by those of ordinary skill in the art that various changes in provide and detail may be made therein without departing from the spirit and scope of the invention as defined by the following claims. The exemplary embodiments should be considered in a descriptive sense only and not for purposes of limitation.

What is claimed is:

1. An organic light emitting diode display, comprising:
    a cover window located in a first plane and comprising a display region and a non-display region surrounding the display region;
    a flexible substrate disposed on a lower side of the cover window, and comprising a first region spaced apart from the cover window and a second region extending from the first region toward the first plane, wherein the flexible substrate comprises a composite substrate of a display substrate of a display panel assembly, and further comprises organic light emitting elements and a base substrate arranged on a lower face of the display panel assembly;
    a first adhesive layer arranged between the cover window and the flexible substrate configured to adhere the cover window and the flexible substrate to each other, and
    a second adhesive layer disposed between the display substrate and the base substrate
    wherein the first region is located in a second plane which is parallel to the first plane.

2. The organic light emitting diode display of claim 1, wherein the flexible substrate is a display substrate comprising a display panel assembly, the display panel assembly comprising organic light emitting elements.

3. The organic light emitting diode display of claim 1, wherein the flexible substrate is disposed on a lower face of a display panel assembly, the display panel assembly comprising organic light emitting elements.

4. The organic light emitting diode display of claim 1, further comprising a polarizing element disposed between the cover window and the flexible substrate.

5. The organic light emitting diode display of claim 1, further comprising a touch panel disposed between the cover window and the flexible substrate.

6. The organic light emitting diode display of claim 5, further comprising a polarizing element disposed between the cover window and the touch panel.

7. The organic light emitting diode display of claim 1, wherein the first adhesive layer comprises an extension portion extending to a space between the cover window and the first region of the flexible substrate in the same plane.

* * * * *